(12) United States Patent
Schram et al.

(10) Patent No.: US 9,094,185 B1
(45) Date of Patent: Jul. 28, 2015

(54) PHASE LOCKED LOOP WITH THE ABILITY TO ACCURATELY APPLY PHASE OFFSET CORRECTIONS WHILE MAINTAINING THE LOOP FILTER CHARACTERISTICS

(71) Applicant: Microsemi Semiconductor ULC, Kanata (CA)

(72) Inventors: Paul H. L. M. Schram, Bergen op Zoom (NL); Krste Mitric, Ottawa (CA); Slobodan Milijevic, Ottawa (CA); Tanmay Zargar, Austin, TX (US); David Colby, Austin, TX (US)

(73) Assignee: MICROSEMI SEMICONDUCTOR ULC, Kanata, Ontario (CA)

( * ) Notice: Subject to any disclaimer, the term of this patent is extended or adjusted under 35 U.S.C. 154(b) by 0 days.

(21) Appl. No.: 14/596,285

(22) Filed: Jan. 14, 2015

Related U.S. Application Data

(60) Provisional application No. 61/928,701, filed on Jan. 17, 2014.

(51) Int. Cl.
*H04L 7/033* (2006.01)
*H03L 7/08* (2006.01)
*H03L 7/06* (2006.01)

(52) U.S. Cl.
CPC ................ *H04L 7/0331* (2013.01); *H03L 7/06* (2013.01); *H03L 7/08* (2013.01)

(58) Field of Classification Search
CPC ......... H03L 2207/50; H03L 7/06; H03L 7/08; H03L 7/0991; H03L 7/0331
See application file for complete search history.

(56) References Cited

U.S. PATENT DOCUMENTS

2010/0214028 A1\* 8/2010 Kobayashi ...................... 331/18
2013/0093469 A1\* 4/2013 Lin et al. ....................... 327/107

\* cited by examiner

*Primary Examiner* — Curtis Odom
(74) *Attorney, Agent, or Firm* — Simon Kahn

(57) ABSTRACT

A digital phase locked loop has a phase acquisition module that outputs a first phase value representative of the phase of a reference signal expressed with respect to an internal phase reference. A phase offset write module convert a phases offset commanded from an external source into a phase offset correction value expressed with respect to the internal phase reference. A phase offset controller sums the phase offset correction values to produce a second phase value, which is added to the first phase value to produce a third phase value expressed with respect to the internal phase reference. A digital controlled oscillator (DCO) outputs a fourth phase value expressed with respect to the internal phase reference. A phase detector outputs a fifth phase value representing the difference between the third and fourth phase values. A loop filter derives a frequency offset for the DCO based on the fifth phase value. An output module generates one or more output clocks from the fourth phase value.

15 Claims, 4 Drawing Sheets

PHASE LOCKED LOOP WITH THE ABILITY TO ACCURATELY APPLY PHASE OFFSET CORRECTIONS WHILE MAINTAINING THE LOOP FILTER CHARACTERISTICS

CROSS REFERENCE TO RELATED APPLICATION

This application claims the benefit under 35 USC 119 (e) of U.S. provisional application No. 61/928,701 filed Jan. 17, 2014, the contents of which are herein incorporated by reference.

FIELD OF THE INVENTION

This invention relates to the field of clock synchronization, and in particular to a phase locked loop (PLL) with the ability to accurately apply phase steps to control the phase offset between the input and the output without compromising the loop filter characteristics.

In digital electronics many systems require that a digital output clock signal be frequency and phase locked to a reference clock source, that the output phase offset to the reference clock be adjustable, and that these phase offset adjustments comply with the loop characteristics of the PLL. Additionally some systems require that the actual phase offset can be read back from the PLL.

A prior art technique for applying a phase offset adjustment is shown in FIG. 1. The phase adjustment module acts on the output phase directly. This can cause the output phase to jump instantaneously, which for some applications and standards specifications is not acceptable.

SUMMARY OF THE INVENTION

Embodiments of the invention provide a PLL that is capable of synchronizing to an input reference clock and simultaneously accepting phase offset adjustments while the output clock(s) respond to the phase adjustments following the loop filter characteristics. Since systems that rely on the output clocks will be designed to follow the characteristics of the PLL, they will inherently be able to follow the phase offset adjustments. As a result the synchronization of the circuits following the output clock will not be lost when applying phase corrections, which may happen when the phase corrections are applied instantaneously (e.g. at the output of the PLL).

According to the present invention there is provided a digital phase locked loop, comprising: a phase acquisition module configured to output a first phase value representative of the phase of a reference signal expressed with respect to an internal phase reference; a phase offset write module configured to convert a phase offset commanded from an external source into a phase offset correction value expressed with respect to said internal phase reference; a phase offset controller for summing said phase offset correction values from said phase offset write module to produce a second phase value; an adder for adding said second phase value to said first phase value to produce a third phase value; a digital controlled oscillator (DCO) configured to output a fourth phase value expressed with respect to said internal phase reference; a phase detector for outputting a fifth phase value representing the difference between said third and fourth phase values; a loop filter configured to derive a frequency offset for said DCO based on said fifth phase value; and an output module configured to generate one or more output clocks from said fourth phase value.

The phase values are generally expressed as the number of internal clock cycles modulo a certain value. The certain value is selected to accommodate the largest phase offset that may be accepted and such that when the digital phase locked loop is in lock, the periods of the output clocks fit an integral number of times into said certain value.

number of internal clock cycles modulo a certain value. The certain value is selected to accommodate the largest phase offset that may be accepted and such that when the digital phase locked loop is in lock, the periods of the output clocks fit an integral number of times into said certain value.

In accordance with embodiments of the invention it will be appreciated that outputs of the phase acquisition module and the DCO output are not in the time domain but are numerical values expressing the phase in system time based on the number of internal clock cycles, typically the central frequency of the DCO, which is driven by a local oscillator. The size of these values is large enough to make it possible to apply phase offsets (positive or negative) that exceed the period of the output signal with the lowest frequency after the output module (e.g. 1 second). At the same time the resolution of these values can be smaller than the system clock to provide accurate movements (e.g. smaller than 1 ns).

Embodiments of the present invention make use of the phase domain property of these internal signals by converting the requested phase offset, which is received over a host interface, into the internal phase domain value and add this (positive or negative) value to the reference phase. In one embodiment this involves applying a scaling factor to convert external phase values to internal phase values.

A typical but non-exclusive application of the invention is in the field of communication networks on nodes that are required to be frame-synchronous. The PLL's providing the clocks for the network nodes will obtain their reference input from frequency accurate clock sources. These clock sources may not provide accurate phase information to align frame signals. From a non-synchronous source, such as IEEE1588, accurate phase information may be recovered and used to adjust the phase offset of the PLL while the PLL stays connected to the input reference without disturbing the synchronization of the connected circuitry.

Another possible application of the proposed invention is to perform a self-test of the PLL and the circuits connected to the output clocks of the PLL. A phase step can be introduced in the PLL, which causes the output to show the typical response of the PLL's Loop filter. The observed response of the PLL can be compared to the expected response as a method of verification. In addition it can be verified that the synchronization of the PLL and its connected circuitry will not be lost for introduced phase steps with a size specified by the applicable standards.

According to another aspect of the invention there is provided a method of applying a phase offset to an output clock generated from a digital phase locked loop (DPLL) including a digital controlled oscillator, comprising: acquiring a first phase value representative of the phase of a reference signal expressed with respect to an internal phase reference of the DPLL; converting a requested phase offset commanded from an external source into a phase offset correction value expressed with respect to an internal phase reference; summing successive phase offset correction values to produce a second phase value; adding said second phase value to said first phase value to produce a third phase value expressed; said digital controlled oscillator (DCO) outputting a fourth phase value expressed with respect to said internal phase reference; outputting a fifth phase value representing the difference between said third and fourth phase values; filtering the fifth phase value to derive a frequency offset for said DCO; and generating one or more output clocks from said fourth phase value.

BRIEF DESCRIPTION OF THE DRAWINGS

The invention will now be described in more detail, by way of example only, with reference to the accompanying drawings, in which:—

DETAILED DESCRIPTION OF EXEMPLARY EMBODIMENTS OF THE INVENTION

Figure 1:
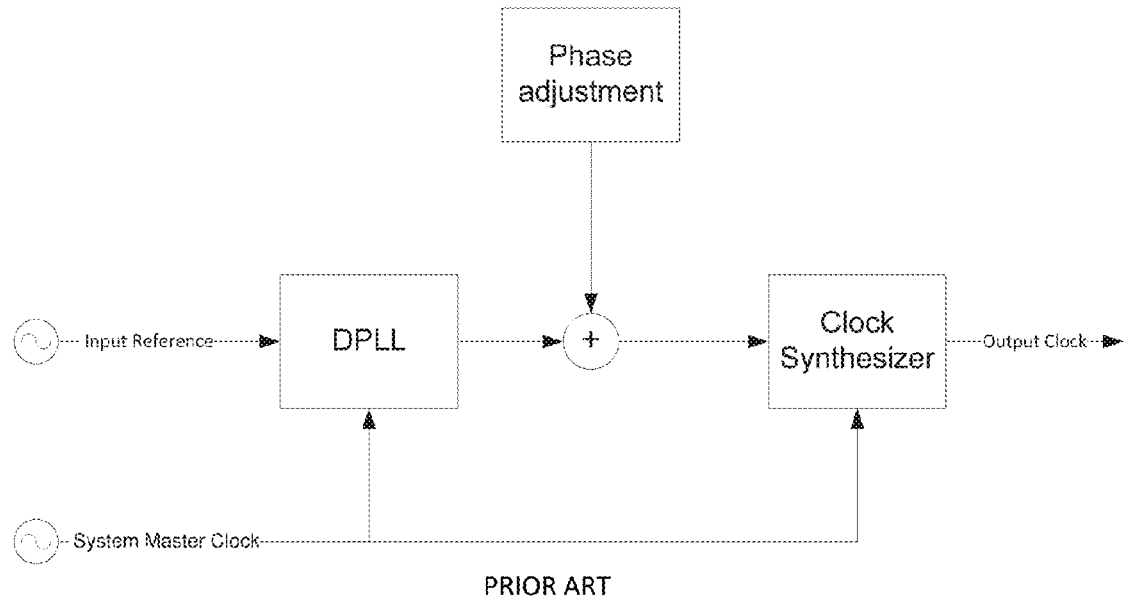
FIG. 1 shows a prior art embodiment of phase offset control at the output of a DPLL.
Figure 2:
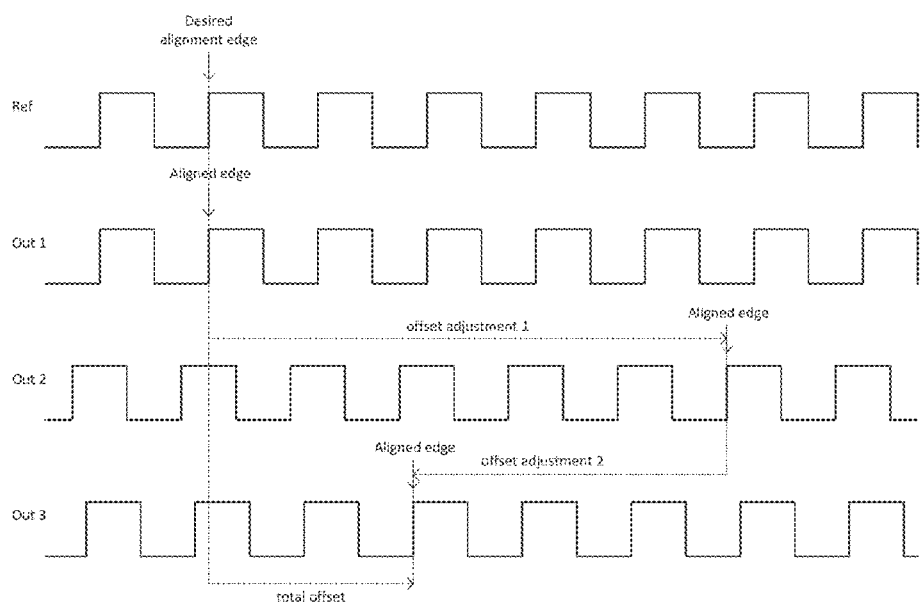
FIG. 2 is the timing diagram showing the results of consecutive phase offset adjustments on the output clock of a PLL with phase offset control.

The timing diagram shown in FIG. 2 is an exemplary scenario in which the invention may be applied. The first waveform indicated "Ref" represents the reference input clock signal to the PLL. The second waveform indicated "Out 1" represents the output signal of the PLL after the PLL has established frequency and phase lock. This clock serves as an internal phase reference for the PLL. The internal phase is expressed an integer value representing a number of whole cycles relative to the leading edge of a cycle plus a fractional part modulo a certain number. That is the phase value is reset to zero when the count reaches the certain number. The "Desired alignment edge" of "Ref" aligns with "Aligned Edge" of "Out 1". After the system has been requested to perform a phase offset correction with size "offset adjustment 1" the PLL will move the "Aligned edge" with the requested offset. This is shown in the waveform indicated "Out 2".

After a second requested phase offset correction with size "offset adjustment 2" the PLL moves the "Aligned edge" with the requested offset; in this example the requested offset has a negative sign. The waveform indicated "Out 3" shows the output clock after the PLL output has performed the second adjustment.

The system can now read back the total phase correction, which is shown as "total offset" by determining the total phase adjustment applied by the system.

Figure 3:
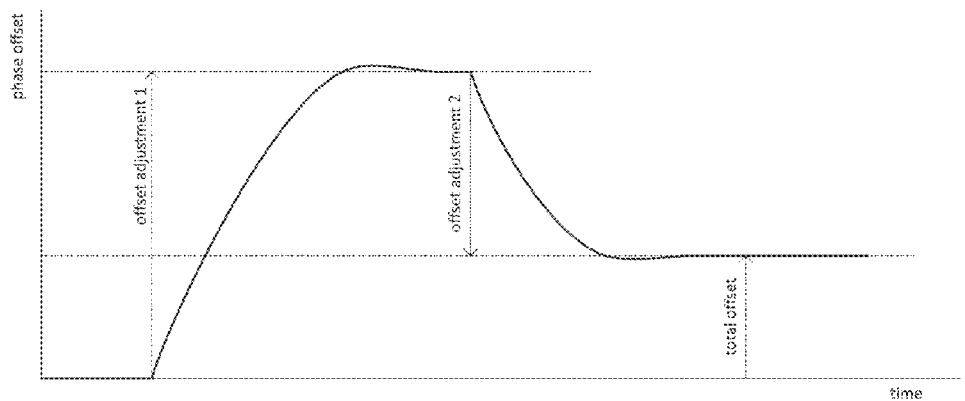
FIG. 3 is a phase response diagram showing the expected result of consecutive phase offset adjustments on the output phase of a PLL with a phase offset control method in accordance with an embodiment of the invention.

How the actual phase offset will appear at the output of the Phase Locked Loop (PLL) for the given example is shown in FIG. 3. This demonstrates that the phase movement on the output follows the characteristics of the loop filter in the Phase Locked Loop (PLL).

Figure 4:
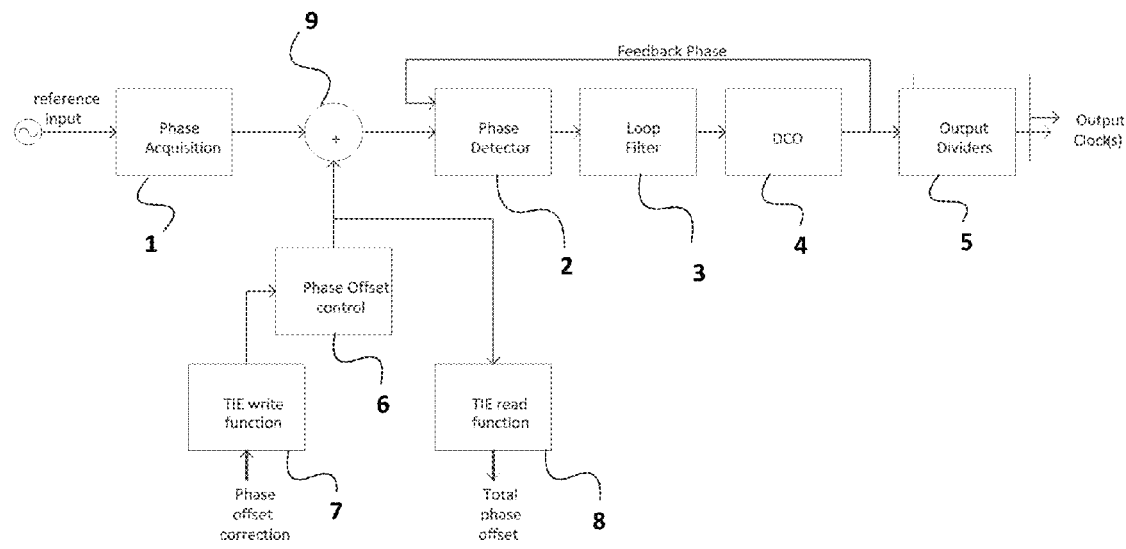
FIG. 4 shows one embodiment of the phase offset control method in accordance with an embodiment of the invention.

An exemplary digital PLL (DPLL) with the ability to accurately apply phase offset corrections while maintaining the loop filter characteristics is shown in FIG. 4.

The phase acquisition module 1 continuously measures the phase of every edge of the clock signal on the reference input and provides the actual phase value to its output expressed with respect to an internal phase reference, and in particular to a number of system clock cycles modulo a certain value. The phase value consists of an integral part (number of clock cycles in the present count plus a fractional part.

The phase detector module 2 measures the phase difference between both inputs, which are respectively the phase output of the phase acquisition module 1 with the phase output value of the phase offset control module 6 (which can be negative) and the feedback phase value output by the DCO 4. The output of the DCO 4 is also expressed as a numeral phase value consisting of an integral part and a fractional part modulo the same certain value. The reference point from which phase is measured is when the output of phase value returns zero. Thus, the phase value represents the number of cycles (and part cycles) since the last restart of the count modulo the certain value. For example, If the phase increments modulo n, after the phase value has reached n−1, it will return to zero.

The output dividers 5 can generate multiple frequencies from the phase output of the DCO 5. As long as the output dividers generate an edge when output value of the DCO is zero, the input and output phases will be correctly aligned. To maintain this situation the period of the output clock must fit an integral number of times into the certain value representing the maximum phase value of the DCO output. Since the output dividers produce multiple frequencies, the certain value is based on the highest common frequency of the output clocks. This is the highest common factor of all the frequencies generated. For example, if one output clock generates a frequency of 19.44 MHz and another output generates a frequency of 2.048 MHz then the largest common frequency is 16 kHz.

$$19.44 \text{ MHz} = 2^7 \times 3^5 \times 5^4$$

$$2.048 \text{ MHz} = 2^{14} \times 5^3$$

In this case the highest common factor (frequency) HCF=$2^7 \times 5^3$=16 kHz

By way of another example, if the central frequency of the DCO 4 is 800 MHz and all output frequencies are integer frequencies, the maximum phase value of the DCO (modulo value) could be selected as 800 million (M). 800M cycles corresponds to one second of phase. This should also be greater than the largest phase shift anticipated.

The same certain value (modulo value) should be used for the phase acquisition module 1. The same reasoning applies. The chosen modulo value needs to work for both the acquisition unit 1 and the DCO, and as noted it needs to be sufficiently large to accommodate the maximum phase jump expected.

The phase detector module 2 produces an output value, which is the phase error also expressed with respect to the same internal phase reference.

The loop filter 3 filters the phase error value coming from the phase detector 2 and converts this to a frequency offset, which is forwarded to the DCO 4. This frequency offset changes the frequency of the DCO 4 so that the output of the phase detector 2 tends to zero. The DCO 4 takes the frequency offset from the loop filter 3 and adds it to the nominal central frequency of the DCO 4, which results in the actual frequency output by the DCO 4. As noted the actual output of the DCO 4 is a phase value expressed in terms of internal clock cycles, which is an integration of the actual frequencies generated by the output dividers 5. This phase value is forwarded to the output dividers 5 and fed back to the phase detector 2. When the output of the phase detector 2 is zero, the DCO 4 is in lock with the input reference with a phase offset determined by the input to phase offset write module 7.

The output dividers 5 generate output clocks based on the phase input from the DCO 4. The phase input is expressed in the terms of the nominal or central frequency of the DCO 4. The output clocks may have different frequencies (scaled up and/or divided down).

The phase offset control module 6 sums the successive phase offset corrections coming from the phase offset write module 7 and forwards the total phase offset value to the adder 9, where it is added to the output of the phase acquisition module 1.

An external host system can write phase offset correction values expressed in units of time using the phase write module 7. The phase write module 7 converts the received desired offset values, which may typically expressed in phase values relative to an external reference phase or time domain, to the phase domain expected by the PLL, which is based on the DCO center frequency, and forward the result to the phase offset control module 6. If the phase values are already in the phase domain, the phase write module converts them into phase values based on the internal clock of the DPLL, which is the center frequency of the DCO 4. If they are in the time domain, the system converts the offset to the internal phase domain. This could be system time (which assumes the system clock for the PLL to be accurate), in which case the conversion involves a simple scaling factor. If the offset is determined relative to the reference time (which assumes the filtered output frequency is accurate), the system has also to include the frequency offset from the filtered frequency.

The host system can read the actual phase offset using the phase read module 8. This converts the output of the phase offset control module 6 to the unit size and format expected by the host system.

Figure 7:
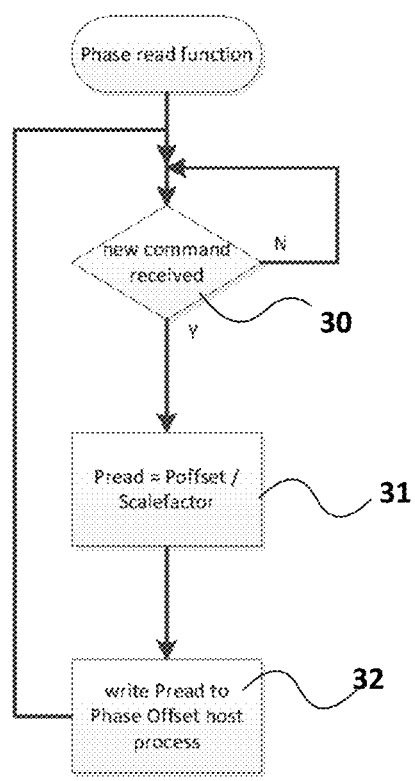
FIG. 7 is a flow chart showing an exemplary implementation of a phase offset read module.

The phase read module 8 works in a similar manner to convert the added phase expressed with respect to the internal reference to a phase expressed with respect to an external reference or a time value. Referring to FIG. 7, at step 31, the algorithm continually determines if a new command has been received. If yes, it scales the phase offset to match the domain of the external host. At step 31, it writes the scaled phase offset to the external host.

The modules 1, 2, 3, 4 and 5 are responsible for the normal PLL behaviour and characteristics. The modules 6, 7 and 8 insert the desired phase offset corrections in the PLL upstream of the feedback loop and provide the host system with the capability to modify the phase offset between the output and the input clocks.

Figure 5:
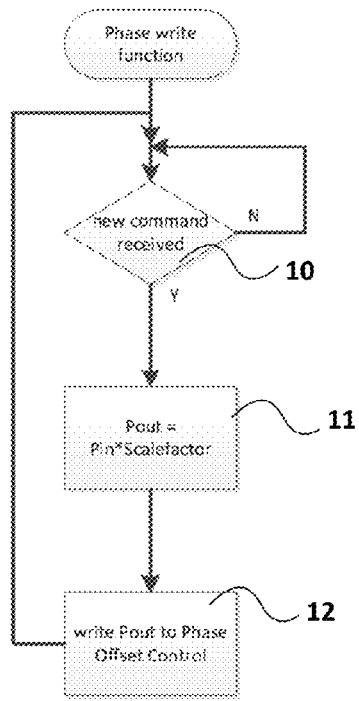
FIG. 5 is a flow chart showing an exemplary implementation of a phase offset write module.

These modules can be implemented in software running on a general purpose processor, such as a digital signal processor. FIG. 5 shows an exemplary implementation of the phase write module 7. In this case, it is assumed that the commanded phase offset is provided in phase units, but it could also be provided in time units.

The algorithm implemented by the processor continually checks for a new phase offset command at step 10. If a command is present, it applies a scale factor at step 11 to express the commanded phase value in internal units of the DPLL. These are based on the center frequency of the DCO 4 and the certain (modulo) value. For example, in the case of certain (modulo) value of 800M, an internal phase may be expressed as a number, such as 2,456,730.25. This would mean that the reference edge of the cycle occurred a quarter of the way through cycle number 2,456,730 starting from cycle 0.

The resulting converted value is written to the phase offset control module at step 12.

Figure 6:
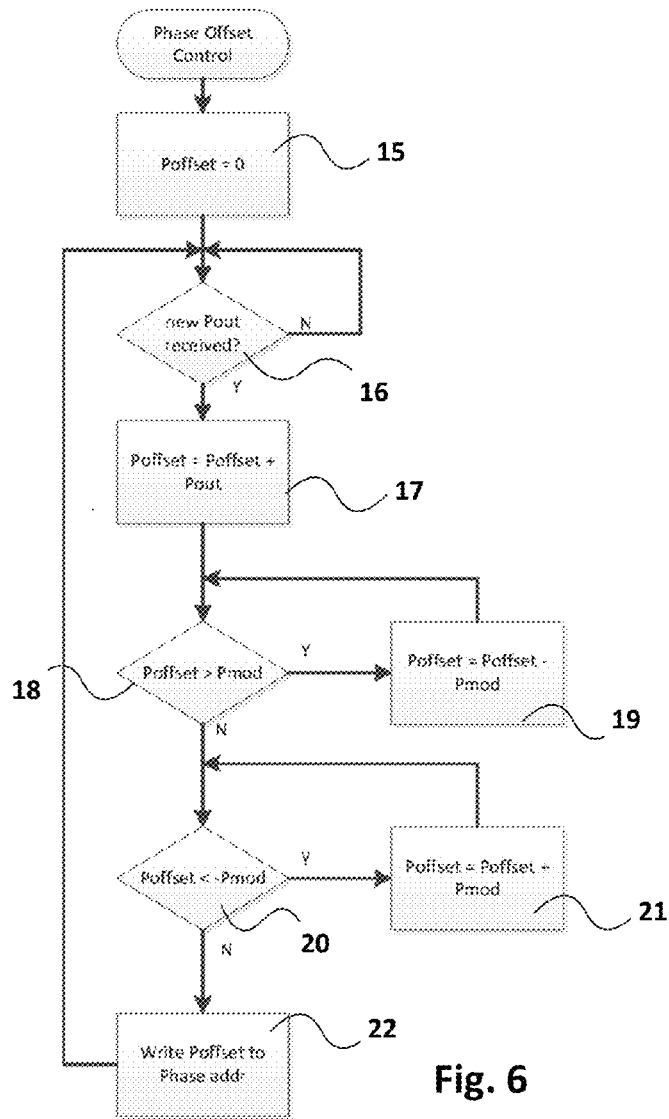
FIG. 6 is a flow chart showing an exemplary implementation of a phase offset controller.

The phase offset control module 6 runs the algorithm shown in FIG. 6 on the same or a different processor. In the initial state, the algorithm starts with a phase offset of 0. Step 16 determines whether a new phase offset has been received; if so, it is added to the current or accumulated value of the phase offset at step 17. Step 18 determines whether the current phase offset is greater than a certain value Pmod. If so, Pmod is subtracted from the current value of the phase offset at step 19 and re-applied to step 17. Step 20 determines whether the current value of the phase offset is less the −Pmod. If so, Pmod is added to Poffset at step 21. The result is added to the output of the phase acquisition unit at step 22.

A DPLL in accordance with embodiments of the invention has the capability to control the phase offset between input reference clock and the output in such a way that the output follows the loop filter characteristics of the phased locked loop. The DPLL can accept phase offset corrections from an alternative path (e.g. network packet interface or software processes). Moreover, such a DPLL can deliver accurate clocks synchronized to a reference input clock but at the same time being phase aligned to a low frequency timing system, for example, a timing system employing timing over packet clock recovery.

It should be appreciated by those skilled in the art that any block diagrams herein represent conceptual views of illustrative circuitry embodying the principles of the invention. For example, a processor may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non volatile storage. Other hardware, conventional and/or custom, may also be included. The functional blocks or modules illustrated herein may in practice be implemented in hardware or software running on a suitable processor.

The invention claimed is:

1. A digital phase locked loop, comprising:
   a phase acquisition module configured to output a first phase value representative of the phase of a reference signal expressed with respect to an internal phase reference;
   a phase offset write module configured to convert a phase offset commanded from an external source into a phase offset correction value expressed with respect to said internal phase reference;
   a phase offset controller for summing said phase offset correction values from said phase offset write module to produce a second phase value;
   an adder for adding said second phase value to said first phase value to produce a third phase value;
   a digital controlled oscillator (DCO) configured to output a fourth phase value expressed with respect to said internal phase reference;
   a phase detector for outputting a fifth phase value representing the difference between said third and fourth phase values;
   a loop filter configured to derive a frequency offset for said DCO based on said fifth phase value; and
   an output module configured to generate one or more output clocks from said fourth phase value.

2. A digital phase locked loop as claimed in claim 1, wherein said phase values are expressed as the number of internal clock cycles modulo a certain value, wherein said certain value is selected to accommodate the largest accepted phase offset and such that when the digital phase locked loop is in lock, the periods of the output clocks fit an integral number of times into said certain value.

3. A digital phase locked loop as claimed in claim 2, wherein said certain value is based on the highest common frequency of said output clocks.

4. A digital phase locked loop as claimed in claim 2, wherein said DCO has a central frequency, and said internal clock cycles are based on said central frequency.

5. A digital phase locked loop as claimed in claim 2, further comprising a phase read module for reading the second phase value and converting said second phase value expressed with respect to said internal phase reference into an external phase value.

6. A digital phase locked loop as claimed in claim 5, wherein said external phase value is expressed in units of time.

7. A digital phase locked loop as claimed in claim 1, wherein the phase offset write module implements the following function:
   upon receipt of a new command, set a variable $P_{out}=P_{in} \times$ Scalefactor, and write $P_{out}$ as an offset correction value to the phase offset controller, where $P_{in}$ is a phase offset correction.

8. A digital phase locked loop as claimed in claim 1, wherein the phase offset controller is programmed to implement the following function:
   upon receipt of a new value of $P_{out}$ from the phase write offset write module, set the current value of a variable $P_{offset}$ to $P_{offset}+P_{out}$, set the value of the variable $P_{offset}$ to the current value of $P_{offset}$ modulo a predetermined value, and write the current value of $P_{offset}$ to the adder as the second phase value.

9. A method of applying a phase offset to an output clock generated from a digital phase locked loop (DPLL) including a digital controlled oscillator, comprising:
   acquiring a first phase value representative of the phase of a reference signal expressed with respect to an internal phase reference of the DPLL;
   converting a requested phase offset commanded from an external source into a phase offset correction value expressed with respect to an internal phase reference;
   summing successive phase offset correction values to produce a second phase value;
   adding said second phase value to said first phase value to produce a third phase value;
   using a digital controlled oscillator (DCO) to output a fourth phase value expressed with respect to said internal phase reference;
   outputting a fifth phase value representing the difference between said third and fourth phase values;
   filtering the fifth phase value to derive a frequency offset for said DCO; and
   generating one or more output clocks from said fourth phase value.

10. A method as claimed in claim 9, wherein said phase values are expressed as the number of internal clock cycles modulo a certain value, wherein said certain value accommodates the largest accepted phase offset and when the digital phase locked loop is in lock, the periods of the output clocks fit an integral number of times into said certain value.

11. A method as claimed in claim 10, wherein said certain value is based on the highest common frequency of said output clocks.

12. A method as claimed in claim 11, wherein said internal clock cycles are based on a central frequency of the DCO.

13. A method loop as claimed in claim 10, further comprising reading the second phase value and converting said second phase value expressed with respect to said internal phase reference into an external phase value.

14. A method as claimed in claim 13, wherein said external phase value is expressed in units of time.

15. A method as claimed in claim 9, wherein upon receipt of a new command, the current value of a variable $P_{out}$ is set to $P_{in} \times$ Scalefactor, where $P_{in}$ is a phase offset correction, and wherein upon generation of a new value of $P_{out}$, the current value of a variable $P_{offset}$ is set to $P_{offset}+P_{out}$, the new current value of the variable $P_{offset}$ modulo a predetermined value produces the second phase value.

* * * * *